United States Patent
Kamp et al.

(10) Patent No.: US 6,939,811 B2
(45) Date of Patent: Sep. 6, 2005

(54) APPARATUS AND METHOD FOR CONTROLLING ETCH DEPTH

(75) Inventors: Tom A. Kamp, San Jose, CA (US); Alan J. Miller, Moroga, CA (US); Vijayakumar C. Venugopal, Hayward, CA (US)

(73) Assignee: Lam Research Corporation, Fremont, CA (US)

( * ) Notice: Subject to any disclaimer, the term of this patent is extended or adjusted under 35 U.S.C. 154(b) by 185 days.

(21) Appl. No.: 10/256,251

(22) Filed: Sep. 25, 2002

(65) Prior Publication Data

US 2004/0084406 A1 May 6, 2004

(51) Int. Cl.[7] .............................. H01L 21/302
(52) U.S. Cl. .............................. 438/734; 438/7; 438/8; 438/16; 438/714; 438/719; 216/60; 216/79
(58) Field of Search ............................. 438/7, 8, 9, 16, 438/714, 719, 734; 216/60, 79; 156/345.25

(56) References Cited

U.S. PATENT DOCUMENTS

| | | | |
|---|---|---|---|
| 5,362,356 A | * 11/1994 | Schoenborn | 216/60 |
| 5,450,205 A | 9/1995 | Sawin et al. | 356/382 |
| 5,807,789 A | 9/1998 | Chen et al. | 438/714 |
| 6,400,458 B1 | 6/2002 | Howald | 356/496 |
| 6,406,924 B1 * | 6/2002 | Grimbergen et al. | 438/9 |
| 2002/0052113 A1 | 5/2002 | Khan et al. | 438/689 |
| 2003/0000922 A1 * | 1/2003 | Subramanian et al. | 216/60 |

FOREIGN PATENT DOCUMENTS

| | | |
|---|---|---|
| JP | 62259444 | 11/1987 |
| JP | 09-129619 | * 5/1997 |

OTHER PUBLICATIONS

U.S. Appl. No. 60/403,213, filed Aug. 13, 2002.
U.S. Appl. No. 60/408,619, filed Sep. 6, 2002.
Nandakumar et al., "Shallow Trench Isolation for Advanced ULSI CMOS Technologies", IEDM 1998, pp. 133–136.
Nandakumar et al., "A Shallow Trench Isolation for Sub–0.13μm CMOS Technologies", IEDM 1997, pp. 657–660.
Murtaza et al., "A Shallow–Trench Isolation Study for 0.13μm CMOS Technology with Emphasis on the Effects of Well Design, Channel–Stop Implants, Trench Depth, and Salicide Process", 1997 Symposium on VLSI Tech., pp. 133–137.

* cited by examiner

*Primary Examiner*—George A. Goudreau
(74) *Attorney, Agent, or Firm*—Beyer Weaver & Thomas, LLP

(57) ABSTRACT

An apparatus and method for etching a feature in a wafer with improved depth control and reproducibility is described. The feature is etched at a first etching rate and then at a second etching rate, which is slower than the first etching rate. An optical end point device is used to determine the etching depth and etching is stopped so that the feature has the desired depth. Two different etching rates provides high throughput with good depth control and reproducibility. The apparatus includes an etching tool in which a chuck holds the wafer to be etched. An optical end point device is positioned to measure the feature etch depth. An electronic controller communicates with the optical end point device and the etching tool to control the tool to reduce the etch rate part way through etching the feature and to stop the etching tool, so that that the feature is etched to the desired depth.

16 Claims, 4 Drawing Sheets

APPARATUS AND METHOD FOR CONTROLLING ETCH DEPTH

FIELD OF THE INVENTION

The present invention relates generally to apparatus and methods for etching features as part of semiconductor device fabrication processes, and more particularly to an optically controlled method and apparatus allowing accurate control of the depth of a feature being etched.

BACKGROUND OF THE INVENTION

There are a number of competing pressures in the fabrication of semiconductor devices. It is important that devices are fabricated accurately so as to either avoid device failure or to reduce the number of devices on a wafer that fail. It is also important that devices meet manufacturing specifications to ensure that the devices operate correctly even if they do not fail. There is also a requirement of reproducibility so that devices fabricated from different wafers all meet manufacturing specifications. Even if an acceptable level of reproducibility is in fact met, there can also be a perceived reproducibility in which designers of devices require comfort that manufacturing specifications can always be met and are not being met merely as a matter of luck.

There is also the competing pressure of throughput which requires semiconductor device manufacturing tools to operate quickly in order to provide a required throughput of devices. However, speed of fabrication tends to militate against the reproducibility and accuracy of device fabrication.

A common step in the fabrication of semiconductor devices is etching a feature into a layer of a wafer. The depth of the feature can often be a critical factor in the correct operation or failure of the device or otherwise a key manufacturing specification.

One mechanism by which people have tried to ensure that features with the correct depth are etched is to provide an etch stop layer in the wafer prior to etching. The presence of an etch stop layer provides a way to prevent the feature from being etched deeper than the etch stop layer, but requires a more complicated wafer structure to start with and is therefore complex and costly. Also, in some devices an etch stop layer cannot be used as it would interfere with the correct operation of the device. Further, it can be necessary to etch into a wafer substrate which does not include an etch stop layer.

Various optical techniques have also been used to control etch processes. For example in a gate manufacturing process, optical emission spectroscopy can be used to determine when a layer of polycrystalline silicon has been etched through. The emission spectrum changes when the gate oxide layer is exposed and begins to etch and so the gate oxide layer can be detected. However, again this requires the presence of a special layer effectively acting as an etch stop indicator in the wafer. Further some etching of the gate oxide layer needs to occur in order to generate the change in the emission spectrum and so the depth of the etch through the polysilicon layer cannot be carefully controlled.

Another method which does not provide sufficiently accurate etch depth control is the use of interferometry based techniques. A single step etch is used to etch the feature and an interferometric end point (IEP) device is used to measure the relative change in depth of the feature that has been etched into the wafer. When the desired relative change in etch depth is measured, the etching is stopped. However, high etch rate processes cannot stop etching immediately and in a reproducible manner and so there tends to be a significant variation in the actual depth etched. The lack of control of etch depth and lack of reproducibility can lead to device failure or to failure to meet manufacturing specifications or to wafer-to-wafer variations that do not meet device designers requirements.

There is therefore a need for a simple, reproducible method for accurately controlling etch depth while still providing sufficient processing throughput.

SUMMARY OF THE INVENTION

A method for etching a feature to a desired depth in a wafer is disclosed. The method includes etching the feature at a first etching rate. The feature is then etched at a second etching rate, which is slower than the first etching rate. The etching depth is optically determined and etching is stopped so that the feature has the desired depth. Using two different etching rates provides high throughput with good depth control. Using a second etching rate slower than the first etching rate facilitates improved optical end point resolution.

According to another aspect, the invention provides a method for etching a trench in a silicon layer of a wafer. The method includes etching at a first etch rate and then etching at a second etch rate slower than the first etch rate. The current etch depth is optically determined and etching is stopped so that the trench depth reaches a desired end point.

According to a further aspect, the invention provides apparatus for etching a feature in a wafer. The apparatus includes an etching tool including a chuck for holding the wafer. An optical end point device is provided and positioned to measure the etch depth. An electronic controller communicates with the optical end point device and the etching tool. The controller controls the tool to reduce the etch rate part way through etching the feature and to stop the etching tool, so that the feature is etched to the desired depth.

BRIEF DESCRIPTION OF THE DRAWINGS

The invention, together with further advantages thereof, may best be understood by reference to the following description taken in conjunction with the accompanying drawings in which.

In the Figures, like reference numerals refer to like components and elements

DETAILED DESCRIPTION OF THE INVENTION

The present invention relates to methods and apparatus for controlling the depth of a feature etched in a wafer during fabrication of a semiconductor device.

Figure 1:
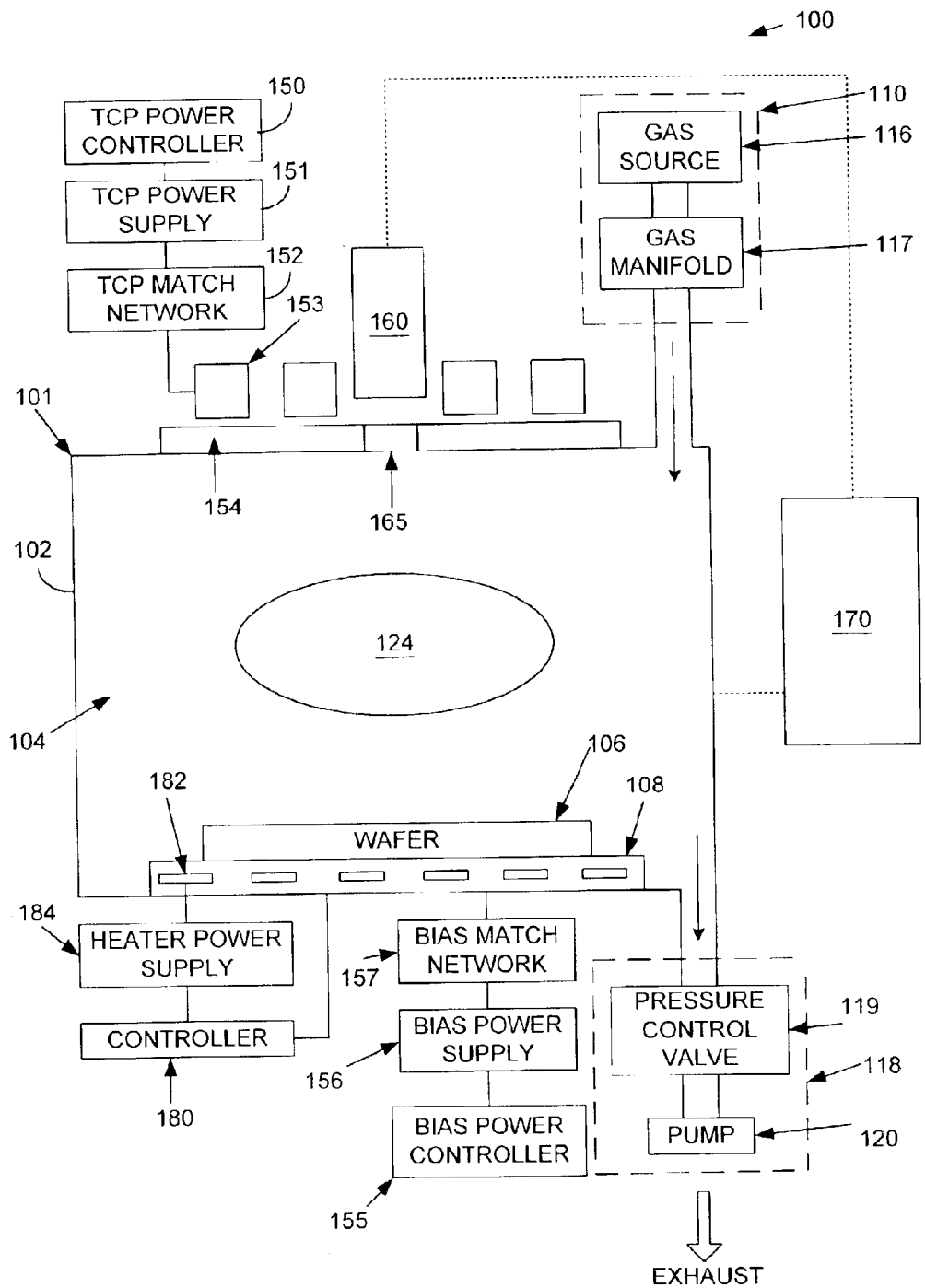
FIG. 1 is a schematic cross sectional view of etching apparatus according to an aspect of the invention.

FIG. 1 is a schematic view of a plasma processing system 100, including a plasma processing tool 101. The plasma processing tool 101 is an inductively coupled plasma etching tool and includes a plasma reactor 102 having a plasma processing chamber 104 therein. A transformer coupled power (TCP) controller 150 and a bias power controller 155 respectively control a TCP power supply 151 and a bias power supply 156 influencing the plasma 124 created within plasma chamber 104.

The TCP power controller 150 sets a set point for TCP power supply 151 configured to supply a radio frequency signal at 13.56 MHz, tuned by a TCP match network 152, to a TCP coil 153 located near the plasma chamber 104. An RF transparent window 154 is provided to separate TCP coil 153 from plasma chamber 104 while allowing energy to pass from TCP coil 153 to plasma chamber 102. An optically transparent window 165 is provided by a circular piece of sapphire having a diameter of approximately 2.5 cm (1 inch) located in an aperture in the RF transparent window 154.

The bias power controller 155 sets a set point for bias power supply 156 configured to supply an RF signal, tuned by bias match network 157, to a chuck electrode 108 located within the plasma chamber 104 creating a direct current (DC) bias above electrode 108 which is adapted to receive a substrate 106, such as a semi-conductor wafer workpiece, being processed A gas supply mechanism or gas source 110 includes a source or sources of etchant gas or gases 116 attached via a gas manifold 117 to supply the proper chemistry required for the etching process to the interior of the plasma chamber 104. A gas exhaust mechanism 118 includes a pressure control valve 119 and exhaust pump 120 and removes particles from within the plasma chamber 104 and maintains a particular pressure within plasma chamber 104.

A temperature controller 180 controls the temperature of heaters 182 provided within the chuck 108 by controlling a heater power supply 184.

In general terms, in plasma chamber 104, substrate etching is achieved by exposing substrate 106 to inonized gas compounds (plasma) under vacuum. The etching process starts when the gases are conveyed into plasma chamber 104. RF power delivered by TCP coil 153 and tuned by TCP matching network 110 ionizes the gases. The power delivered by electrode 108 induces a DC bias on substrate 106 to control the direction and energy of ion bombardment of substrate 106. During the etching process, the plasma reacts chemically with the surface of the substrate 106 to remove material not covered by a photoresistive mask.

In one preferred embodiment of the invention, a suitable plasma processing tool would be the 2300 Versys Silicon Etch System, as provided by Lam Research Corporation of Fremont, Calif.

In one embodiment, the etching system includes a single wavelength interferometric end point device 160 located external to the plasma processing chamber 104. Optical access to the plasma processing chamber is provided by window 165 comprising a sapphire insert, approximately 2.5 cm (one inch) in diameter, in an aperture in the RF transparent window 154. The end point device 160 is positioned adjacent to the window 165 and is positioned so as to be able to measure the depth of features etched into the wafer 106 in a direction substantially perpendicular to the plane of the wafer. The end point device 160 generates and transmits a substantially single wavelength, or narrow band (bandwidth $\leq 10$ nm), of light which is reflected from the wafer surface and monitored in real time during an etch process as will be described in greater detail below. In one embodiment of the invention, the end point device 160 is provided as an integrated part of the plasma processing chamber 104 or etching tool 101.

The etching system 100 also includes electronic control circuitry 170 in communication with the end point device 160 and the etching tool 101. The electronic control circuitry includes electrical and optical devices to process the optical signals from the end point device to provide electrical signals indicating the current depth of an etched feature and also electrical signals to control the operation of the etching tool. The electronic control circuitry 170 can be in the form of a suitably programmed general purpose digital computer. The electronic control circuitry 170 constantly monitors the relative change in depth of a feature being etched in the wafer and can control the etching operation of the etching tool according to the etching method described below.

In another embodiment of the invention, a broadband (spectral range approximately 190–1000 nm) reflectometry based technique and device are used to optically determine the end point of an etch process, instead of the single narrow wavelength band technique and device referred to above. The broadband measuring device and technique can provide an absolute measure of feature depths. The technique involves using a deterministic approach to parametrically estimate feature depths by matching modeled and measured broadband spectra at any instant in time. A suitable broadband reflectometry technique is described in U.S. Provisional Patent Application Ser. No. 60/403,213 filed on Aug. 13, 2002, entitled "Endpoint Strategies for in situ Control of Recess and Deep Trench Etch Processes" in the names of Vijaykumar C Venugopal and Andrew J Perry and U.S. Provisional Patent Application Ser. No. 60/408,619 filed on Sep. 6, 2002, entitled "Reflectometry-based Approaches For in situ Monitoring of Etch Depths in Plasma Etching Processes" in the names of Vijaykumar C Venugopal and Andrew J Perry, both of which are hereby incorporated by reference in there entirety for all purposes.

Figure 4:
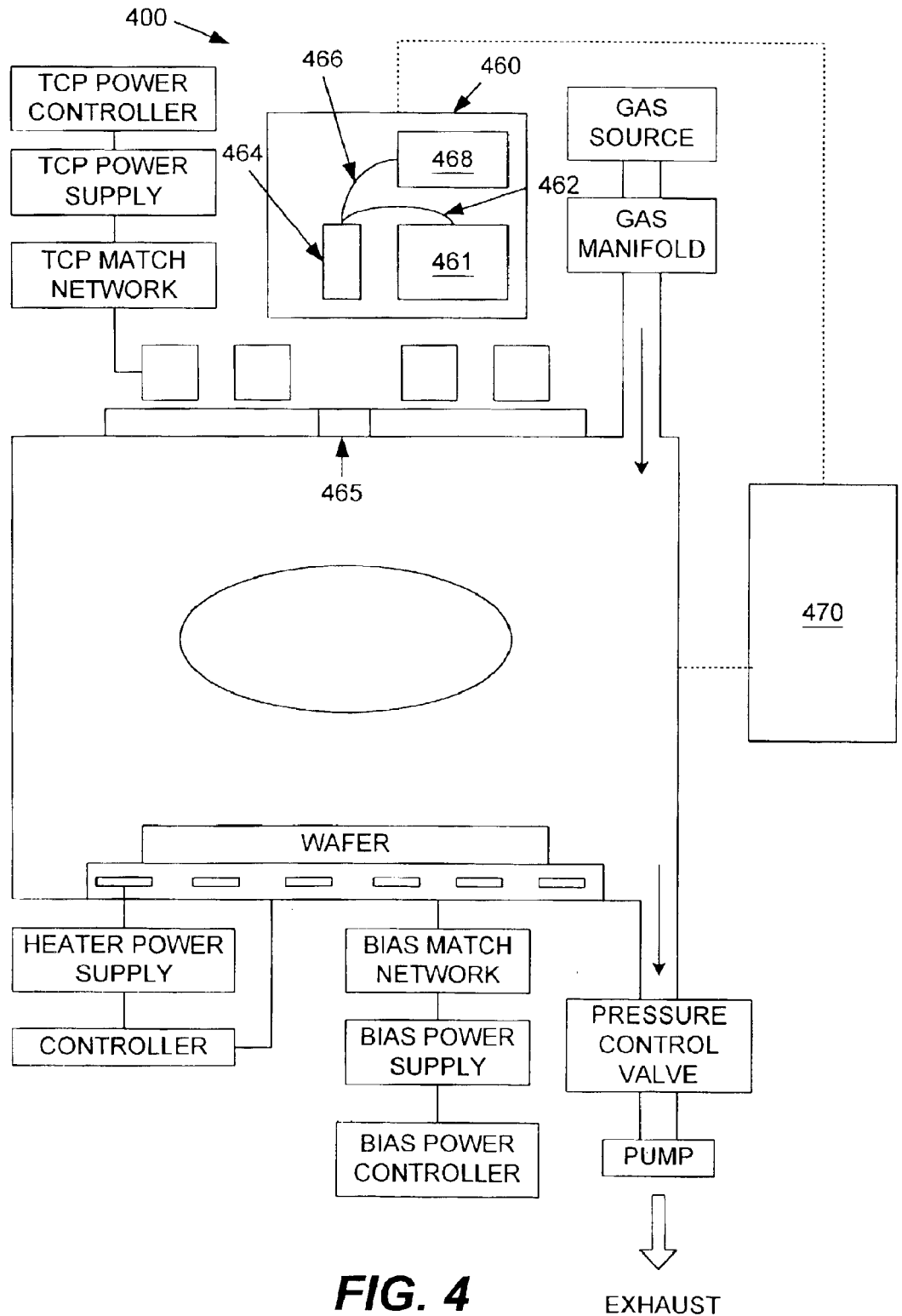
FIG. 4 is a schematic cross sectional view of another embodiment of etching apparatus according to an aspect of the invention.

FIG. 4 shows a schematic cross sectional drawing of an etching system 400 similar to that shown in FIG. 1, but including the broadband end point measuring device 460. Broadband end point measuring device 460 includes a source 461 of broadband radiation, connected by a length of UV grade optical fiber 462 to a collimator 464 adjacent the sapphire window 465. The collimator 464 is connected by another length of UV grade optical fiber 466 to a 190–1000 nm spectrograph 468 which is connected to control circuitry 470. Control circuitry 470 is adapted to process signals from the broadband end point 460 device and determine the etch depth in this embodiment.

Figure 2:
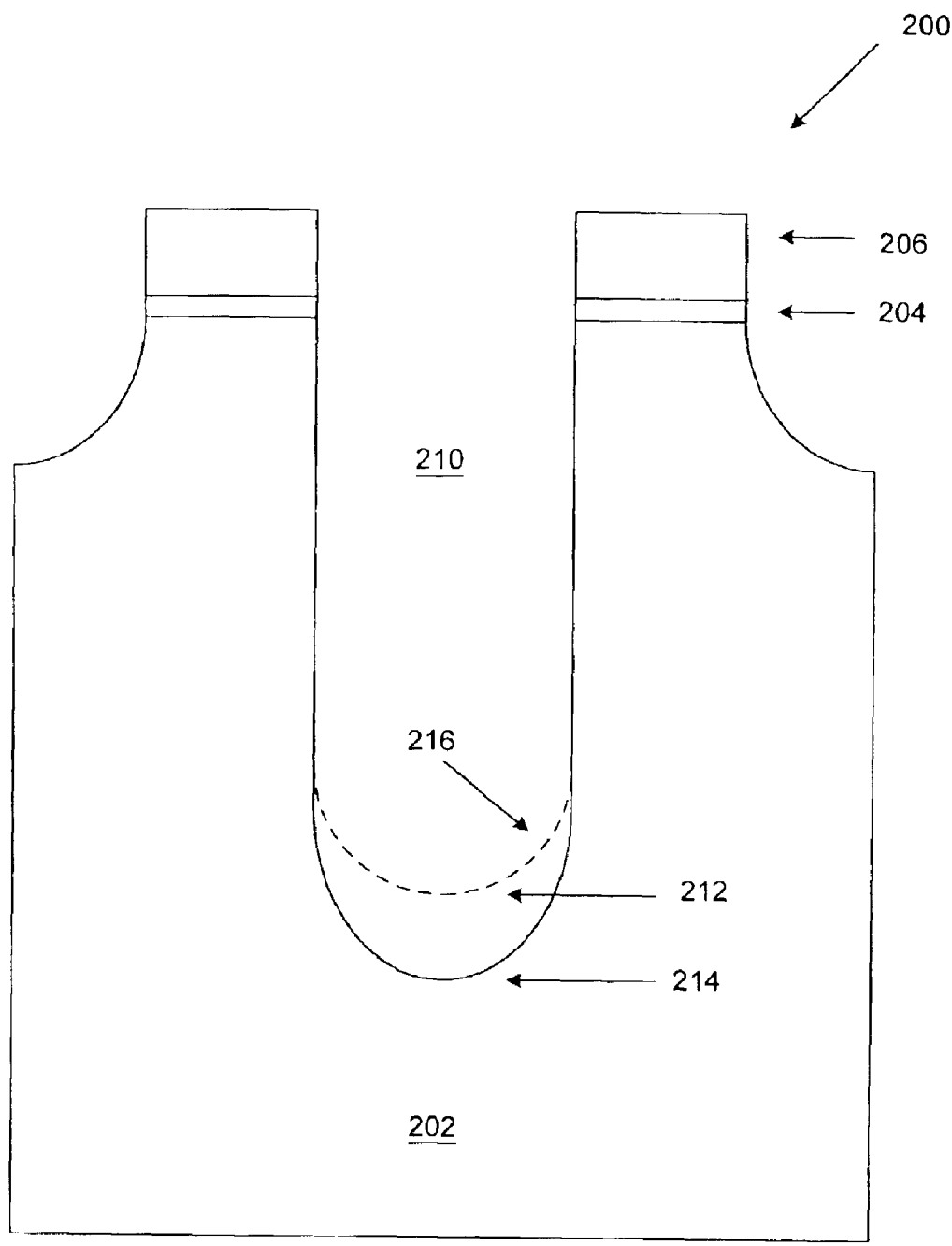
FIG. 2 is a schematic cross sectional view of a wafer having a trench etched in it according and illustrating the etching method of the invention.
Figure 3:
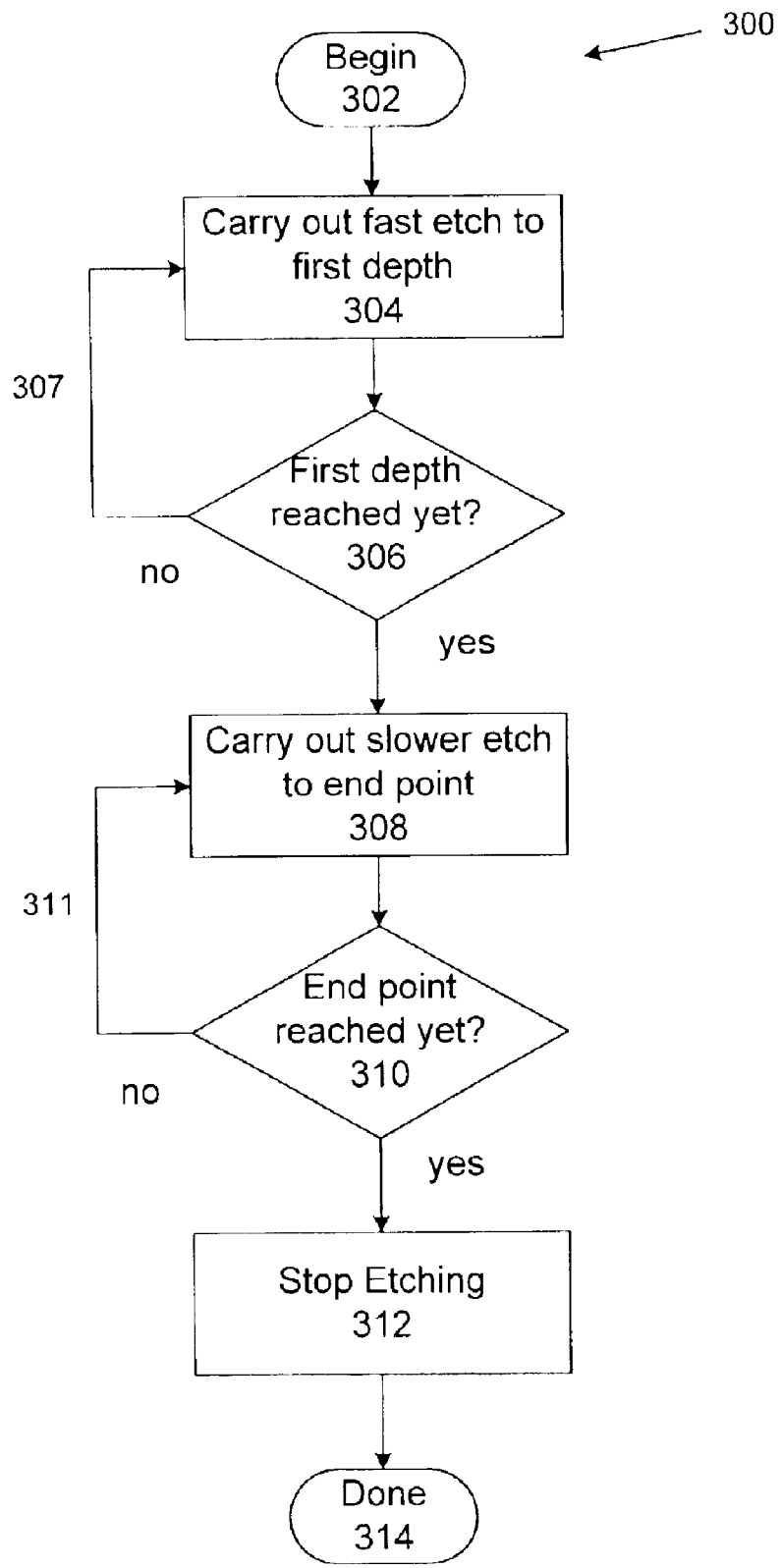
FIG. 3 shows a flow chart illustrating the etching method of the invention.

In use, the etching tool 101 is controlled to strike and sustain a plasma 124 in the plasma chamber 104 which is used to etch the desired feature in the wafer 106. The etching method will now be described with particular reference to FIGS. 2 and 3. FIG. 2 shows a schematic cross section of a part of a wafer 200 etched according to the method and FIG. 3 shows a flow chart 300 illustrating the etching method. An embodiment of the method will be described with reference to etching a trench in a silicon substrate layer of a wafer as part of a shallow trench isolation (STI) process.

FIG. 2 shows the wafer 200 after the etching process has been carried out. The wafer includes a crystalline silicon substrate layer 202, a pad oxide layer 204 and a silicon nitride hard mask layer 206 which has previously been patterned to define the location of the trench feature 210 to be etched.

At the start of the method 302 a first high etch rate etch of the trench is carried out 304. A high etch rate can be considered to be an etch rate greater than approximately 4000 Å/min. An etch rate of approximately 5000 to 8000 Å/min can be used for the first fast etch 304. The depth of the feature being etched is monitored 306 to determine whether the feature has reached a first depth 212 a substantial way toward the target end point depth 214 desired for the feature. The first depth 212 can be more than approximately 65% of the end point depth 214, preferably more than approximately 70% of the end depth and more preferably more than approximately 80% of the end depth. The first depth 212 can be in the range of approximately 65 to 85% of the end point depth 214, and more can be in the range of approximately 80 to 85% of the end point depth 214.

The high etch rate etch can be carried out using the following operating conditions and recipe: a plasma pressure in the range of approximately 10 to 70 mT, a TCP power in the range of approximately 500 to 1400 W, a bottom electrode bias in the range of approximately 0 to 800 W and an etchant gas composition including Ar, $Cl_2$, HBr, $CF_4$, $O_2$, $SF_6$ and He. Any suitable etchant gas mixture and etching tool operating parameters can be used which provides the required high etch rate etch of the feature in the wafer 200.

The progress of the etch is monitored 306 in situ by the optical end point device 160 and control circuitry 170 and the first high rate etch 304 is continued 307, until it is determined 306 that the current trench depth has reached the first depth 212. The high etch rate process provides a good profile to the bottom of the trench 216 including a smooth rounded bottom surface. This is advantageous as it helps to avoid the formation of voids when the trench is filled with an oxide material and so helps to obviate device failure.

A second, slower etch is then carried out 308 which has a lower etch rate than the first etch. An etch rate of less than approximately 3000 Å/min can be considered slow for an STI process. However, the rate of the second etch step is selected so that it substantially preserves the smooth and rounded profile of the trench bottom so that the completed trench has the desired profile.

When the optical end point device and control circuitry determine that the cross over depth 212 has been reached, the etching tool is controlled to reduce the etching rate so that the trench is etched to the desired end point depth 214 at a slower rate. This can be achieved by changing the composition of the etchant gas such that HBr is used as the source of etchant species and changing the operating parameters of the etching tool, although other methods can be used to provide the desired slow etching rate. The following etching gas composition and etching tool operating parameters can be used to provide an etch rate of approximately 1000–3000 Å/min: a plasma pressure in the range of approximately 10 to 80 mT, a TCP power in the range of approximately 200 to 1200 W, a bottom electrode bias in the range of approximately 0 to 500 W and an etchant gas composition including Ar, $Cl_2$, HBr, $CF_4$, $O_2$, $SF_6$ and He.

The progress of the slower etch rate etch is monitored 310 in situ by the optical end point device 160 and control circuitry 170 to determine whether to stop the etch so that the trench will land at the desired end point depth 214, or keep etching 311. Carrying out a slower trench depth landing 308 means that greater resolution can be provided by the optical end point measuring device and more time is available in which to control the etching tool so as to stop the etch at an appropriate time so that the trench depth is correct. So the accuracy of measurement of the depth of the trench is improved. When it is determined 310 that the end point has been reached, the etching tool is controlled to stop etching 312 the trench. The etching process then ends 314 and provides an etched trench with the desired depth 214 and also having the desired profile and with a high throughput rate, as the bulk of the etching has been carried out at a high etch rate.

Etching can be stopped 312 either when the measured depth corresponds to the desired feature depth 214, or alternatively, before the measured depth reaches the desired feature depth, for example if there is some 'overshoot' in the etching process. The latter embodiment can be used where it is not possible to instantaneously stop etching. In that case, this is compensated for by controlling the etching tool to stop etching before the desired depth is actually reached so that the trench actually lands at the desired depth rather than overshooting the desired depth.

When using high etch rates only, the variations in end point triggering time, plasma ignition, RF ramping and match tuning from wafer to wafer can be sufficient to put the wafers outside of the acceptable range of reproducibility. Indeed variations in less than 1 second of the processing time can be sufficient for trenches in wafers from different processes not to meet manufacturing reproducibility tolerances. By adding the slower etch rate step, the invention not only improves the resolution and therefore accuracy with which the end point can be determined, but also improves the reproducibility of the process from wafer to wafer as any variations in the total process time caused by lags or variations in the etching tool will not create as large a variation in the trench depth owing to the slow etching rate up to the end point. Further, a slow etch rate may not provide the desired trench profile properties. However, using a high etch rate process, allows the desired trench profile to be generated, which can then be usefully propagated by the slow etch, provided that the slow etch is not carried out for a length of time sufficient to significantly alter the trench profile. Also the combination of high and low etch rate means that a high manufacturing throughput rate of wafers with high reproducibility can be provided.

When using a single narrow wavelength band IEP device and technique, the depth of the trench is monitored constantly as this technique can only measure the depth relative to a starting position (e.g. the wafer surface prior to starting the etch). If a broadband reflectometry technique, or other optical end point technique which can measure absolute depth values, is used, then the depth of the trench does not need to be constantly monitored throughout the entire etch process, but only toward the end, when it is necessary to determine how much further to etch using the slow rate, or additionally, to determine when to stop the fast etch and change over to the slow etch. In one embodiment of the invention, the method can include using the current measured depth of the trench to determine when to change to the slower etch rate and can control the etching tool to automatically change the etch rate. Alternatively, the first high rate etch can be carried out for a fixed period of time after which the etch rate is decreased and the depth of the trench is measured to ensure landing at the desired depth.

The method is not limited to the use of two different etch rates only. For example, three or more different etch rates could be used with a corresponding number of cross over depths. Further, the cross over between etching rates need not be instantaneous (step change) and can be a gradual (continuous) change in the etch rate, so that the etch rate change occurs over a region rather than at a specific depth.

The above description has been in the context of an STI process, but the invention is not limited to such processes.

For example, the invention can also be used in recess processes. A recess process is typically used in the fabrication of memory cell devices. A trench is etched in a layer of silicon and a collar of dielectric material is fabricated around the top of the trench. The trench is filled with an amount of polysilicon which overlaps an amount of the dielectric collar so as to provide a capacitive device having a desired capacitance. However, variations in the trench depth would change the amount of polysilicon overlapping the dielectric collar and therefore the capacitance. Therefore careful silicon trench depth control is an important aspect of fabricating such devices.

What can be considered 'high' and 'low', or 'fast' and 'slow', etch rates will depend on the context of the depth of the feature being etched. If a 5% variation is depth is an acceptable reproducibility metric, then 5% of a very deep feature is a greater distance than 5% of a very shallow feature, and so can be etched correspondingly more quickly. For example in the STI process described above a typical trench depth can be in the range of approximately 2,000 to 5,000 Å, in which case a high etch rate can be approximately 4000 Å/min and higher and a low etch rate can be 3000 Å/min and lower. For deep trench processes trench depths of 100,000 to 150,000 Å can be required. In this context, high etch rates can be 10,000 Å/min and higher and low etch rates can be 5,000 Å/min and lower.

The ratio of etch rates (high:low) can be greater than 1.3:1, preferably greater than 1.5:1, more preferably greater than 2.5:1 and most preferably greater than 3.5:1, The etch rate ratio (high:low) can be in the range from about 1.5:1 to 2.5:1, preferably from about 2.5:1 to 3.5:1 and more preferably about 3.5:1 to 10:1.

Therefore the present invention can be used in the etching of various features, and not just trenches, and in various fabrication processes to provide improved etch depth control and wafer to wafer reproducibility.

Although the foregoing invention has been described in some detail for purposes of clarity of understanding, it will be apparent that certain changes and modifications may be practiced within the scope of the appended claims. Therefore, the described embodiments should be taken as illustrative and not restrictive, and the invention should not be limited to the details given herein but should be defined by the following claims and their full scope of equivalents.

What is claimed is:

1. A method for etching a feature having a feature depth in a layer of a wafer, the method comprising:
   etching to a first depth of the feature at a first etching rate;
   etching from the first depth to a second depth at a second etching rate, the second etching rate being slower than the first etching rate;
   optically determining when the second depth has reached the feature depth; and
   stopping etching the feature, wherein the wafer is a crystalline silicon wafer, wherein the feature is etched into the crystalline silicon wafer.

2. The method of claim 1, wherein etching to a first depth includes forming a desired profile of the feature.

3. The method of claim 2, wherein etching from the first depth to the second depth substantially retains the desired profile of the feature.

4. The method of claim 1, wherein the first etch depth is in the range of approximately 65 to 85 percent of the feature depth.

5. The method of claim 1, wherein the feature is a trench.

6. The method of claim 1, wherein the layer is a crystalline silicon layer.

7. The method of claim 1, wherein the etching depth is optically determined throughout the method.

8. The method of claim 7, further comprising optically determining when the first depth has been reached.

9. The method of claim 1, wherein the etching rate is changed by changing the composition of an etchant.

10. The method of claim 1, wherein the layer does not have an associated etch stop indicator.

11. The method of claim 1, wherein the layer does not have an etch stop layer.

12. The method of claim 1, wherein the optical determination is carried out using an optical end point technique.

13. The method of claim 12, wherein the optical end point technique is selected from the group comprising interferometric end point and broadband reflectometry based end point.

14. The method of claim 1, wherein the method is part of a process selected from the group comprising recess and shallow trench isolation.

15. The method of claim 1, wherein an absolute feature depth is optically determined.

16. A method for etching a feature having a feature depth in a layer of a wafer, the method comprising:
   etching to a first depth of the feature at a first etching rate;
   etching from the first depth to a second death at a second etching rate, the second etching rate being slower than the first etching rate;
   optically determining when the second depth has reached the feature depth; and stopping etching the feature, wherein the method is part of a process for shallow trench isolation.

* * * * *